United States Patent [19]
Fishbein et al.

[11] Patent Number: 5,471,081
[45] Date of Patent: Nov. 28, 1995

[54] SEMICONDUCTOR DEVICE WITH REDUCED TIME-DEPENDENT DIELECTRIC FAILURES

[75] Inventors: Bruce J. Fishbein, Marlboro; Brian S. Doyle, Framingham, both of Mass.

[73] Assignee: Digital Equipment Corporation, Maynard, Mass.

[21] Appl. No.: 26,625

[22] Filed: Mar. 4, 1993

Related U.S. Application Data

[63] Continuation of Ser. No. 672,002, Mar. 18, 1991, abandoned, which is a continuation of Ser. No. 510,164, Apr. 16, 1990, abandoned.

[51] Int. Cl.$^6$ .............................. H01L 29/68; H01L 29/78
[52] U.S. Cl. ....................... 257/356; 257/364; 257/409; 257/655
[58] Field of Search ............................ 357/23.1, 23.2, 357/59; 257/356, 364, 409, 655

[56] References Cited

U.S. PATENT DOCUMENTS

| | | | |
|---|---|---|---|
| 3,571,914 | 3/1971 | Lands et al. | 29/571 |
| 3,646,527 | 2/1972 | Wada et al. | 340/173 R |
| 3,663,870 | 5/1972 | Tsutsumi et al. | 317/235 R |
| 3,767,483 | 10/1973 | Tokuyama et al. | 148/186 |
| 4,479,831 | 10/1984 | Sandow et al. | 148/1.5 |
| 4,486,943 | 12/1984 | Ryden et al. | 29/571 |
| 4,600,933 | 7/1986 | Richman | 357/23.12 |
| 4,755,865 | 7/1988 | Wilson et al. | 357/63 |
| 4,794,433 | 12/1988 | Kamiya et al. | 357/23.5 |

FOREIGN PATENT DOCUMENTS

| | | |
|---|---|---|
| 0111347 | 6/1984 | European Pat. Off. . |

OTHER PUBLICATIONS

Lu et al, "Anomalous C–V Characteristics of Implanted Poly MOS Structure in N+/P+ Dual–Gate CMOS Technology", IEEE Elect. Dev. Ltrs, May '89.

Wong et al, "Doping of N+ and P+ Polysilicon in Dual–Gate CMOS Process", Int'l Electron Devices Meeting, Dec. 11–14, '88, pp. 238–241.

Research Disclosure, No. 286, Feb., 1988, p. 108.

Kunio, "MIS Type Field–Effect Transistor", Patent Abstracts of Japan, Aug. 14, 1985.

Muller & Kamins "Device Electronics for Integrated Circuits" ©1985 pp. 399–405, 490–493.

Glasser et al., "The Design and Analysis of VLSI Circuits" ©1986 pp. 76–90.

Primary Examiner—Jerome Jackson
Assistant Examiner—Donald L. Monin, Jr.
Attorney, Agent, or Firm—Arnold, White & Durkee

[57] ABSTRACT

An insulated gate field-effect transistor or similar semiconductor-insulator-semiconductor structure has an increased time-dependent dielectric failure lifetime due to a reduction in the field across the gate insulator. The electric field in the gate insulator is reduced without degrading device performance by limiting the field only when the gate voltage exceeds its nominal range. The field is limited by lowering the impurity concentration in a polysilicon gate electrode so that the voltage drop across the gate insulator is reduced. In order to avoid degrading the device performance when the device is operating with nominal voltage levels, a fixed charge is imposed at the interface between the gate electrode and the gate insulator, so at a gate voltage of about the supply voltage level the response changes to exhibit less increase in the drop across the gate insulator for higher voltages. Also, the impurity level in the gate electrode may be low enough so that the gate is in deep depletion for transient increases in gate voltage, thereby limiting the drop across the gate insulator.

5 Claims, 4 Drawing Sheets

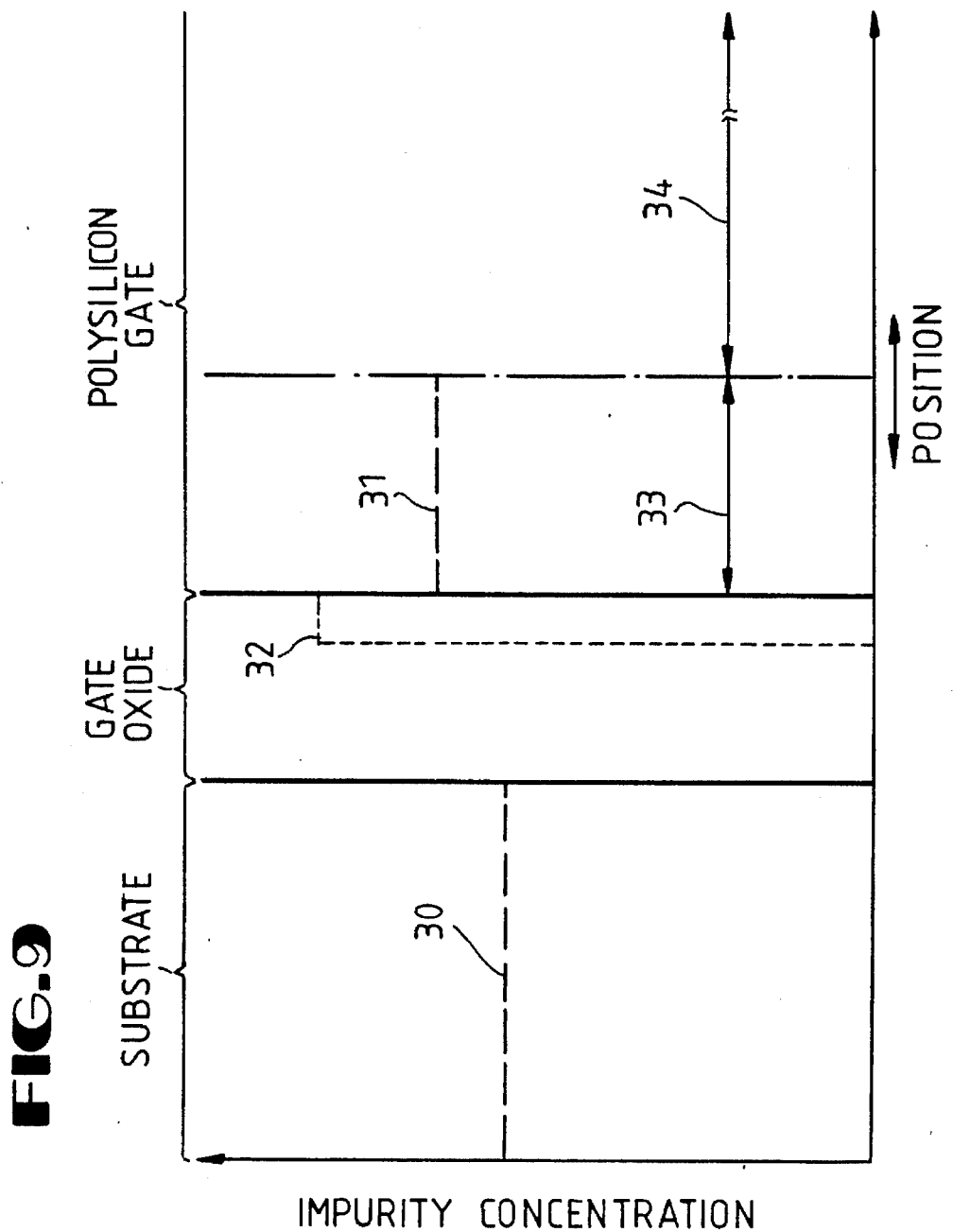

SEMICONDUCTOR DEVICE WITH REDUCED TIME-DEPENDENT DIELECTRIC FAILURES

This is a Continuation of application Ser. No. 07/672,002 filed Mar. 18, 1991, now Abandoned, which is a Continuation of application Ser. No. 07/510,164 filed Apr. 16, 1990, now Abandoned.

BACKGROUND OF THE INVENTION

This invention relates to semiconductor devices and methods of manufacture, and more particularly to protecting the gate insulator of an MOS type of field-effect transistor from the effects of over-voltage or the like.

In microelectronic technology, semiconductor-insulator-semiconductor structures are widely used, as in the polysilicon-gate metal-oxide-semiconductor field-effect transistor (MOSFET) employed in most memory and microprocessor devices made today. A voltage is applied to the gate electrode in these devices to create an inversion layer of charge carriers in the substrate, beneath the gate. The charge carriers form a conductive path between source and drain regions, giving rise to current flow when drain bias is applied. The voltages applied to the gate are chosen to ensure an adequately high inversion charge density when the transistor is on, and low leakage current when the transistor is off. Application of this gate voltage creates an electric field in the gate insulator, however, and if the field is sufficiently high, charge carriers can tunnel into or through the insulator. The interaction of these charge carriers with the insulator is responsible for several failure mechanisms, generally known as time-dependent dielectric failure. Due to the physical relationship between tunneling current and electric field, the lifetime of the integrated circuit device with respect to time-dependent failures decreases exponentially with increasing electric field in the insulator. As a result, small increases in gate voltage can lead to large reductions in lifetime of the devices due to time-dependent failures.

The time-dependent failure lifetime of a particular integrated circuit device depends upon the device structure and the applied bias conditions. Because electrons tunnel into the gate insulator more easily than holes, the time-dependent failure lifetime is shorter in situations where electrons are the tunneling species. This occurs most frequently in N-channel devices biased into inversion, i.e., a positive voltage applied between the gate and source.

Due to power supply ringing, bond wire inductance, capacitive coupling and other effects, the gate voltage can exceed its nominal range by very significant amounts. It is not uncommon to experience voltage transients exceeding the nominal power supply voltage by more than one volt, which is substantial in integrated circuit devices using 5 V or 3 V power supplies. Because of the exponential dependence between time-dependent failure lifetime and gate voltage described above, the lifetime can be dominated by these voltage transients.

Methods previously employed to deal with the problem of time-dependent dielectric failure fall into three categories. One is lowering the supply voltage, which also lowers the magnitude of most of the transients. Another is increasing the thickness of the gate insulator or improving the quality of the gate insulator so that it degrades more slowly. The third is that of designing the circuit such that transients are minimized.

Lowering the supply voltage and increasing the dielectric thickness are very effective ways to increase the time-dependent failure lifetime. The disadvantage of these techniques is that the associated reduction in inversion charge density leads to a reduction in device performance. Changes in circuit design which minimize transients are also difficult to achieve without a sacrifice in performance. Attempts to increase the robustness of the material used as the dielectric have resulted in improvements which are generally quite small, and alternative dielectrics can introduce other problems such as increased process complexity, reduced yield, and high densities of interface traps.

SUMMARY OF THE INVENTION

In accordance with one embodiment of the invention, the electric field in the gate insulator of a MOS field-effect transistor or the like is reduced without degrading device performance. This is achieved by limiting the field only when the gate voltage exceeds its nominal range. The field is limited by lowering the impurity concentration in a polysilicon gate electrode so that the voltage drop across the gate insulator is reduced. In order to avoid degrading the device performance when the device is operating with nominal voltage levels, a fixed charge is imposed at the interface between the gate electrode and the gate insulator. This results in minimal depletion of the gate electrode for voltages less than the supply voltage, and rapid increasing depletion for voltages above the supply voltage. Also, the impurity level in the gate electrode may be low enough so that the gate is in deep depletion for transient increases in gate voltage, thereby further limiting the drop across the gate insulator.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 9 is a graphic representation of impurity concentration vs. position in the gate-insulator-channel area of the device of FIG. 1.

DETAILED DESCRIPTION OF SPECIFIC EMBODIMENT

Figure 2:
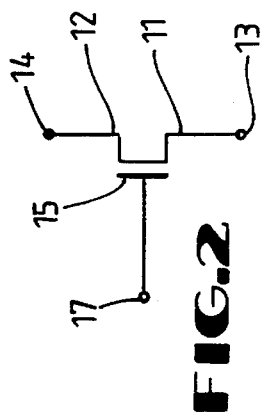
FIG. 2 is an electrical diagram in schematic form of the transistor of FIG. 1.
Figure 1:
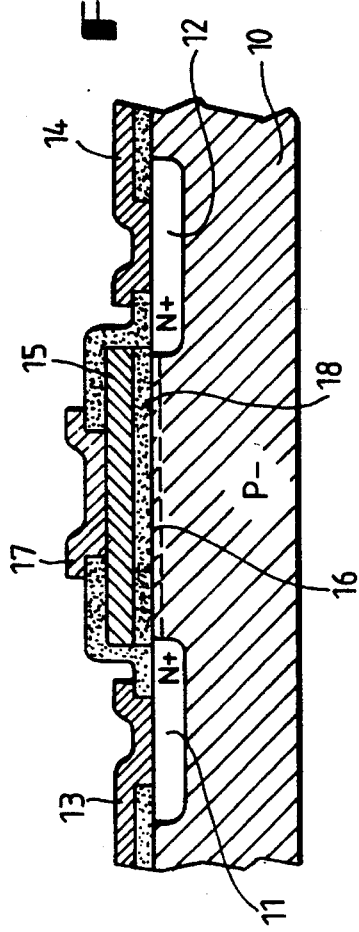
FIG. 1 is an elevation view in section of an N-channel MOS field-effect transistor which may employ the features of the invention.

Referring to FIGS. 1 and 2, an N-channel MOS transistor is shown formed in a silicon substrate 10 and having source and drain regions 11 and 12, with connections made to the source and drain by metallized areas 13 and 14. A polycrystalline silicon gate electrode 15 overlies a channel area 16 between the source and drain, and a connection is made to the gate by a metallization area 17 contacting the polysilicon. A gate insulator 18 separates the gate electrode from the channel. It is common practice to dope the polysilicon gate electrode 15 to a high level, e.g., a phosphorus or arsenic concentration of more than about $10^{20}/cm^3$, to thereby reduce the resistance of the polysilicon connections extending between various points in the integrated circuit. However, according to a feature of the invention, the polysilicon gate 15 is doped at a different level as will be explained.

Figure 3:
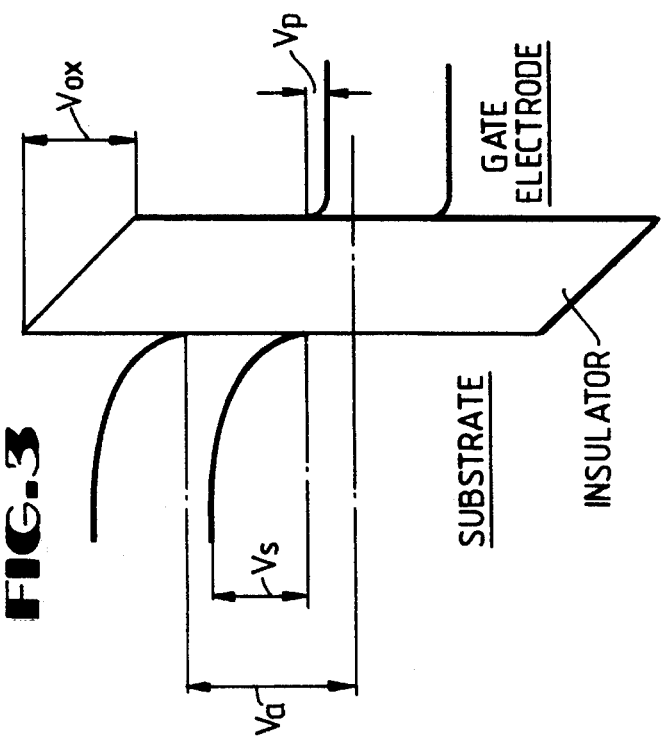
FIG. 3 is an energy band diagram of the gate-insulator-channel area of the device of FIG. 1, without employing the lowered gate electrode doping according to a feature of the invention.

Referring to FIG. 3, an energy band diagram is shown for the area of the MOS transistor device of FIG. 1 which includes the gate electrode 15, the gate insulator 18 and the channel region 16, for typical doping levels used for polysilicon gates, i.e., without employing the lowered gate electrode doping according to a feature of the invention. Band diagrams of this type are useful tools for visualizing voltage drops and electric fields in a semiconductor device such as that of FIG. 1. In band diagrams such as those that appear in FIGS. 3 and 4, the electrical potential for electrons (in volts) is plotted as a function of position in the device structure. It can be seen in FIGS. 3 and 4 that the applied voltage between the gate 15 and the inversion layer in the channel area 16 of the substrate 10 is dropped across three regions: the depletion layer in the substrate 10, the gate insulator 18, and the depletion layer in the gate electrode 15. Quantitatively, the applied voltage can be expressed as $$V_a = V_s + V_{ox} + V_p + V_{ms}$$

where $V_a$ is the applied voltage, $V_s$ is the voltage drop across the substrate depletion layer, $V_{ox}$ is the voltage drop across the oxide layer 18, $V_p$ is the voltage drop in the depletion layer of the gate electrode 15, and $V_{ms}$ is due to the work-function difference between the materials of the gate electrode 15 and the substrate 10. Solving the above equation for $V_{ox}$ gives $$V_{ox} = V_a - V_s - V_p - V_{ms}$$

showing that the voltage drop across the insulator 18 is linearly related to the applied voltage and to the voltage drop in the gate electrode. For a fixed $V_a$, $V_{ox}$ will decrease as $V_p$ increases. Since the electric field in the insulator 18 is just $V_{ox}$ divided by the insulator thickness, $V_p$ has a direct effect on insulator field.

The depletion layer voltage drops $V_s$ and $V_p$ depend on the applied voltage $V_a$, and on the doping levels in the substrate 10 and in the gate electrode 15. A heavily doped gate electrode 15 will have a lower voltage drop in its depletion layer than will a lightly doped gate electrode under the same applied voltage. The higher $V_p$ in the lightly doped gate insulator will result in a lower $V_{ox}$ and therefore a lower insulator field and a longer time-dependent failure lifetime.

Figure 4:
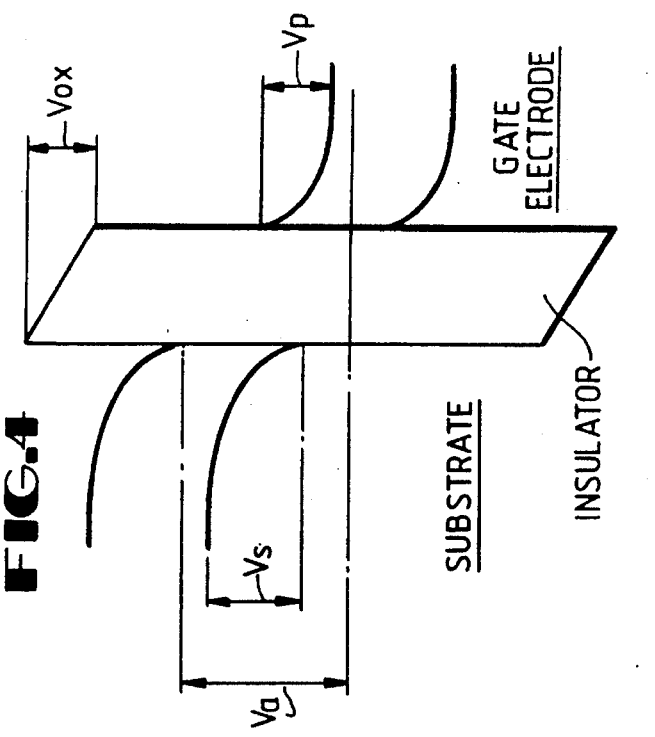
FIG. 4 is an energy band diagram as in FIG. 3 showing a gate-insulator-channel area of the device of FIG. 1, employing lowered gate electrode doping to reduce the voltage drop across the gate dielectric, according to a feature of the invention.
Figure 5:
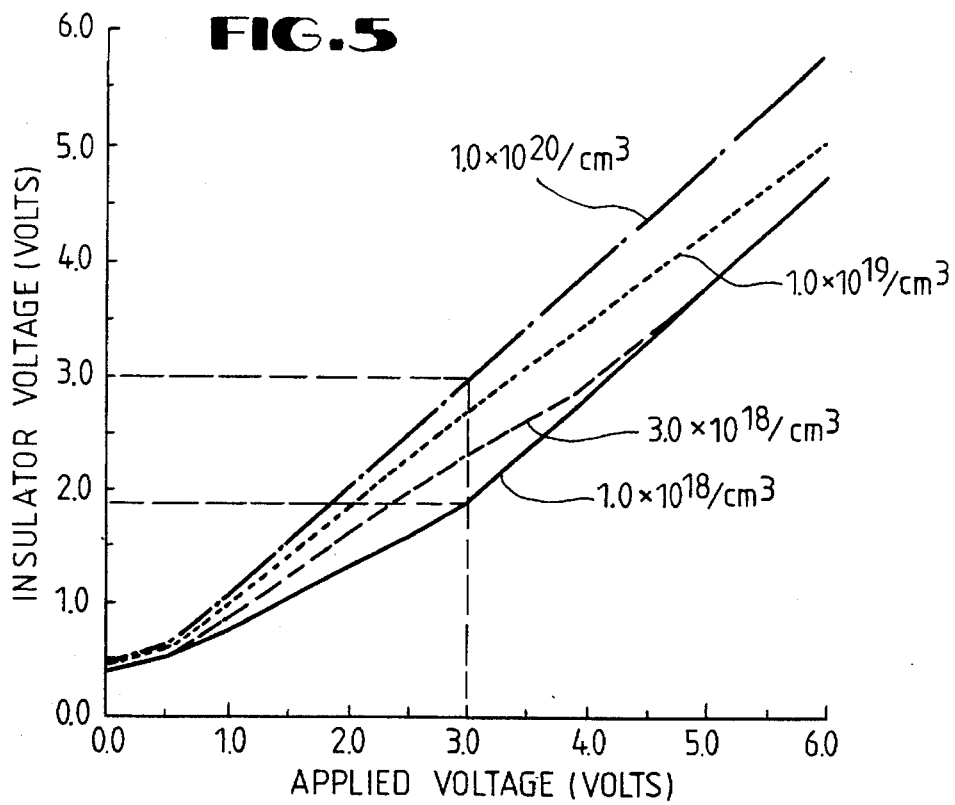
FIG. 5 is a plot of voltage drop across the gate insulator vs. applied gate voltage, for an MOS field effect transistor as in FIG. 1, illustrating the voltage drop for various levels of gate doping.

The dependence of $V_{ox}$ on gate electrode doping is illustrated in FIGS. 3 and 4, which show band diagrams of two semiconductor-insulator-semiconductor structures under the same applied voltage $V_a$, one with a heavily doped gate electrode (FIG. 3) and one with a lightly doped gate electrode (FIG. 4). It is apparent that the effect of the light doping in the gate electrode 15 is to increase $V_p$ which results in a corresponding decrease in $V_{ox}$. FIG. 5 shows the results of a simulation (using the PISCES program) in which the gate electrode doping is varied between $1.0 \times 10^{18}/cm^3$ and $1.0 \times 10^{20}/cm^3$. The plot shows the voltage drop across the insulator 18 as a function of applied voltage between gate and substrate. For very high gate electrode doping levels (above about $1.0 \times 10^{20}/cm^3$), $V_{ox}$ is almost equal to $V_a$ due to the fact that $V_p$ is very small, and $V_s$ and $V_{ms}$ (in the above equations) cancel each other out in this particular structure. As the gate electrode doping is lowered, $V_{ox}$ decreases until it reaches about one volt below its value at high gate electrode doping. This saturation effect occurs because the gate electrode 15 goes into inversion Oust as the substrate does), after which there is no further change in the voltage drop across the depletion region.

The decrease in electric field in the insulator 18 that can be achieved by reducing the doping level in the gate electrode 15 is effective in increasing the time-dependent failure lifetime of the dielectric, but it also results in an undesirable loss of transistor performance. The performance loss arises from the decrease in $V_{ox}$ at applied voltages lower than the nominal supply voltage. For example, consider the case when the supply voltage for the device represented in FIG. 5 is 3.0 volts. When the applied voltage is equal to the supply voltage, a decrease in the doping level in the gate electrode decreases $V_{ox}$. This will result in a decrease in the inversion charge density $Q_i$, which is related to $V_{ox}$ by $$Q_i = \frac{V_{ox} * C_{ox}}{q}$$

where $C_{ox}$ is the insulator capacitance (gate-to-channel capacitance in FIG. 1), q is the electronic charge ($1.6 \times 10^{-19}$ coulombs), and $Q_i$ is the inversion charge density in #/cm². Since the device performance parameters such as transconductance and drain current are proportional to $Q_i$, a decrease in $V_{ox}$ at applied voltages below the supply voltage will result in a performance loss. In order to avoid this problem, it is preferable to maintain the maximum possible $V_{ox}$ at applied voltages up to the supply voltage, and then to reduce $V_{ox}$ at applied voltages greater than the supply voltage.

According to one feature of the invention, this effect is achieved by raising the voltage at which the gate electrode depletion layer begins to form through the use of either non-uniform doping in the gate electrode 15 or providing a fixed charge in the insulator 18 near the interface between the insulator 18 and the gate electrode 15. Both of these techniques have been used previously for threshold control of the inversion layer in the substrate of conventional MOSFETs. The shift in threshold voltage due to charge in the insulator is $$\Delta V_t = qQ_f/C_{ox}$$

where $\Delta V_t$ is the shift in threshold voltage, $Q_f$ is the effective amount of fixed charge at the insulator-gate electrode interface (in #/cm$^2$), and $C_{ox}$ is the insulator capacitance. The threshold shift in the case of non-uniform gate electrode doping depends on the total amount of dopant, and its spatial distribution. If a thin, heavily doped layer is introduced near the insulator interface of a uniformly doped gate electrode, then the threshold shift can be approximated by the equation above, where $Q_f$ becomes the total amount of added dopant at the surface.

Figure 6:
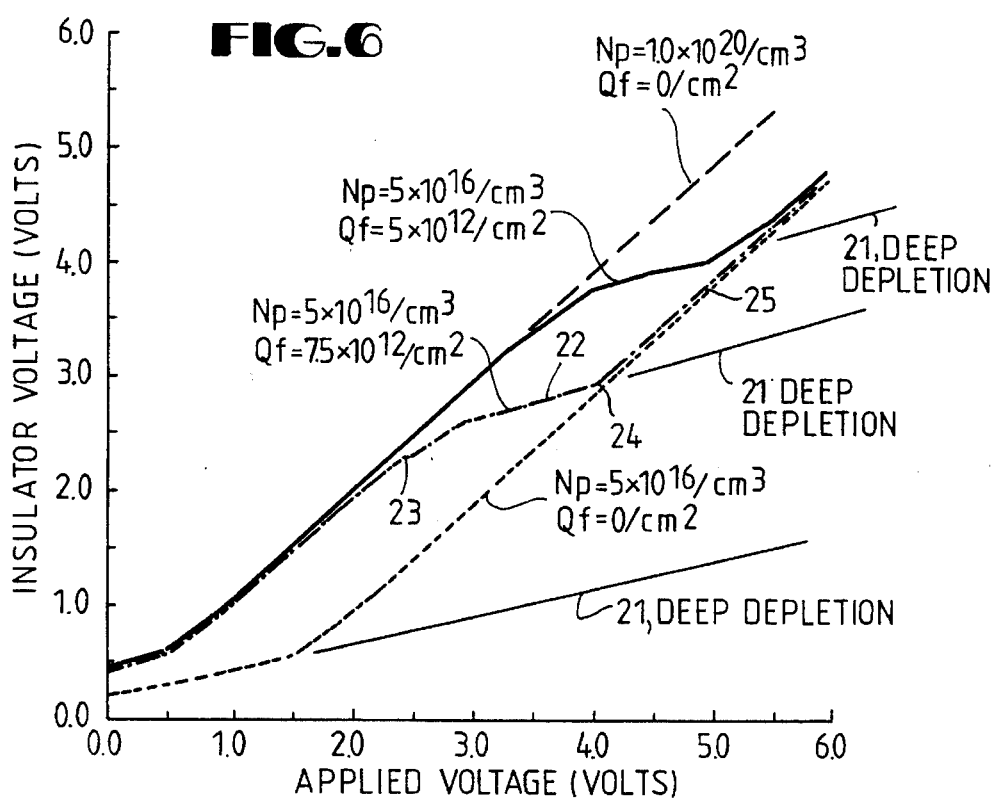
FIG. 6 is a plot of voltage drop across the gate insulator vs. applied gate voltage, for an MOS field effect transistor as in FIG. 1, illustrating the voltage drop for various levels of fixed charge near the gate-electrode/insulator interface, at varying gate doping.

The effect on $V_{ox}$ of shifting the gate electrode threshold voltage is shown in FIG. 6, where $V_{ox}$ is plotted as a function of applied voltage for devices with low gate electrode doping and various amounts of fixed charge. In the cases where fixed charge is introduced, the lower portion of the solid curve shows that the substrate inversion threshold or transistor turn-on voltage is about 0.5 volts, and $V_{ox}$ follows this curve corresponding to heavy gate electrode doping until the gate electron inversion threshold voltage is reached. At this point, the gate electrode comes out of accumulation and begins to deplete. After about one volt is dropped across the depletion region, the gate electrode becomes inverted and no further voltage drop develops.

Figure 7:
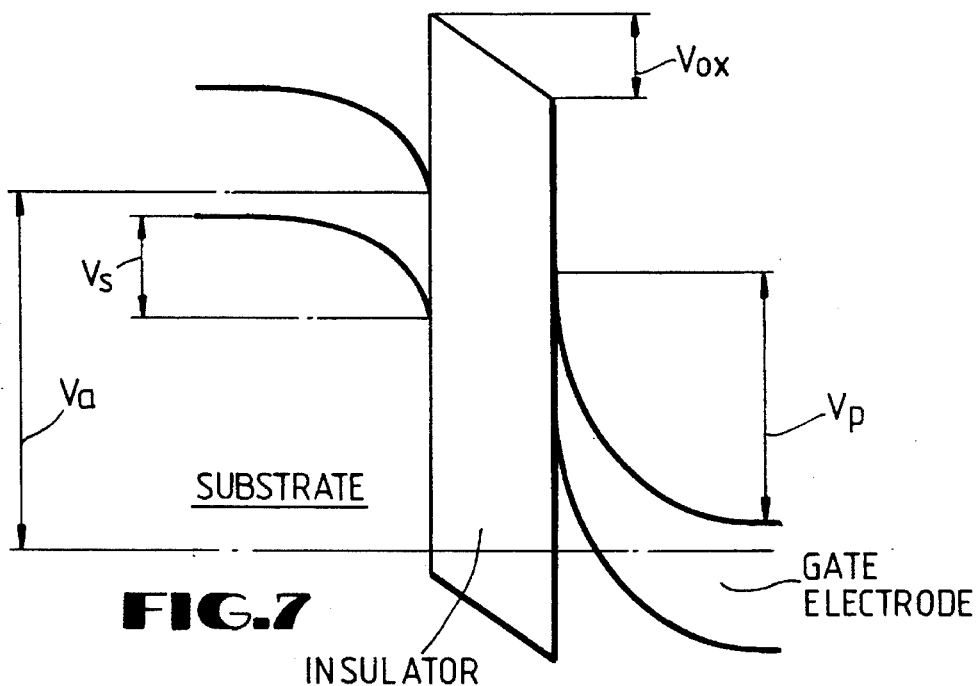
FIG. 7 is an energy band diagram as in FIGS. 3 or 4 showing a gate-insulator-channel area of the device of FIG. 1, employing lowered gate electrode doping to exhibit a condition of deep depletion, according to a feature of one embodiment of the invention.

Deep depletion is a non-equilibrium condition in which there are insufficient minority carriers available to form an inversion layer. As a result, the semiconductor continues to deplete as the applied voltage is increased beyond the point at which the inversion layer would normally form. The voltage drop in the deep-depleted region can be much larger than the one volt maximum that occurs during equilibrium, thereby increasing the amount of field reduction at high applied voltages. This effect is illustrated in FIG. 7, where the band diagram of a structure in deep depletion is shown. As described above, the maximum applied voltage to a semiconductor-insulator-semiconductor structure often occurs during transients which can be of very short duration (on the order of nanoseconds). Since the time required to reach equilibrium under many conditions is much longer than this, it is likely that deep-depletion will occur during the voltage transients, resulting in substantial additional reduction in insulator field during these transient periods, even though under steady-state conditions the reduction in the drop across the insulator would be limited to about one volt as discussed above. This benefit is shown in FIG. 6, where lines 21 indicate the effects of deep-depletion. For the condition of $N_p=5\times10^{16}$/cm$^3$ and $Q_f=7.5\times10^{12}$/cm$^2$, for example, if deep depletion were not a factor, the voltage drop across the insulator 18 would follow the curve 22 for applied voltages above the knee 23 at about 2.5 V until the knee 24 at about 4.0 V then would follow the asymptotic line 25 due to the inversion of the gate electrode 15. The effect of deep depletion causes the insulator voltage to follow the line 21 at the knee 24, exhibiting a much shallower increase in insulator drop for increased applied voltage, and, since the overvoltage condition is most likely a transient, the applied voltage will have gone back to its nominal level (3.0 V or less) before the effect of deep depletion has been exhausted. Thus, under the conditions depicted in FIG. 6, the device can sustain a transient voltage of 6.0 V while subjecting the insulator 18 to no more than about 3.5 V because the remainder of the voltage will be dropped in the polysilicon electrode 15.

Figure 8A:
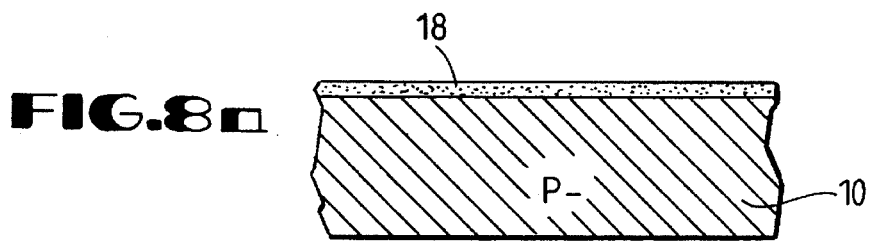
FIGS. 8a–8c are elevation views in section of a small portion of a semiconductor wafer, corresponding generally to FIG. 1, at successive stages in the manufacture of a field-effect transistor as seen in FIG. 1.
Figure 8B:
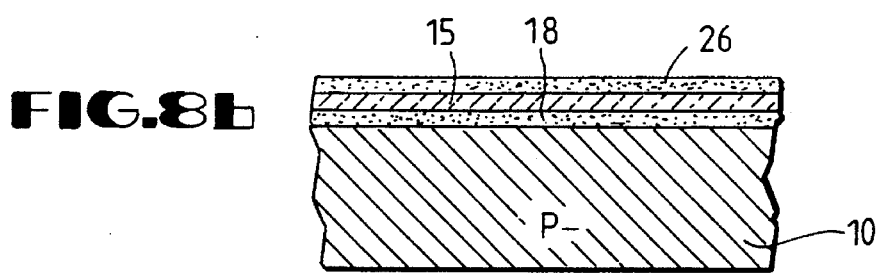
Figure 8C:
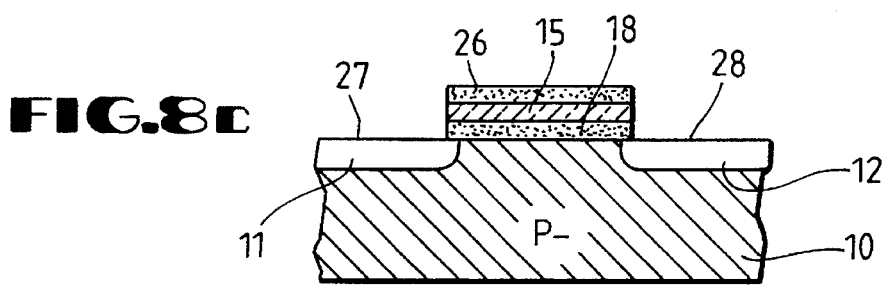

A method of making the N-channel MOS transistor of FIG. 1 would ordinarily employ the polysilicon gate 15 as an implant mask for implanting an impurity, usually arsenic, to create the source and drain regions 11 and 12. The lightly-doped gate electrode must therefore be protected from the source/drain implant since it will already be in place. Referring to FIG. 8a, a process for making the device of FIG. 1 starts with a silicon substrate 10 having a layer 18 of thermal oxide grown thereon, and this structure is subjected to an implant of an ionic species such as cesium into the upper surface of the insulator, using a dosage of about $7.5\times10^{12}$/cm$^2$ as mentioned above. The polysilicon gate layer 15 is next deposited over the gate insulator 18 as seen in FIG. 8b, and this deposition is done in the presence of a phosphorus compound at a concentration such that the doping level of the deposited polysilicon is about $5\times10^{16}$/cm$^3$. A protective layer 26 is deposited over the polysilicon, then this sandwich is patterned by photomasking and etching to open holes 27 and 28 for the source/drain implant. Referring to FIG. 8c, the source/drain implant of arsenic or other N-type impurity creates the source and drain regions 11 and 12 but this implant does not penetrate the protective layer to change the doping level of the gate layer 15. The protective layer 26 may be silicon oxide, in which case it may be left in place to insulate the gate from overlying metallization layers, or it may be a temporary layer of nitride or photoresist, so long as it functions as an implant mask. Instead of creating the fixed charge at the gate-to-insulator interface by the cesium implant as described, this may be accomplished by first depositing a very thin part of the polysilicon layer 15 over the insulator 18, then performing an implant at a dosage and energy level to place the ions at the interface, then depositing the remainder of the gate 15.

Referring to FIG. 9, a representation of impurity concentration vs. position in the field effect transistor or FIG. 1 is illustrated. In FIG. 9, it is seen that the substrate doping level in the region just beneath the gate oxide 18 is at a level 30, while the doping level in the region of the gate 15 just above the gate oxide is at a level 31. The concentration in the upper, positively-charged region of the gate oxide at the oxide-to-gate interface is at a level 32. The light-doping level 31 need only be present for a depth 33 in the lower part of the gate electrode, and this distance 33 must be greater than the maximum depletion width in the polysilicon gate. In the region 34 of the gate above the distance 33, the doping can be much higher to reduce the sheet resistance since the polysilicon is used for interconnects, or, if desired, the doping level can remain low.

Although discussed above in the context that the semiconductor device employing the features of the invention is a field-effect transistor as seen in FIG. 1, it is understood that other semiconductor devices could advantageously use these features. For example, a semiconductor-insulator-semiconductor capacitor as used in dynamic RAM cells is susceptible to time-dependent failures due to the gate dielectric in the capacitor. Since a dynamic RAM device of the 1-Mbit or 4-Mbit size contains capacitor dielectric as a large fraction of the chip area, this failure mechanism is important, and so the increase in lifetime provided by the features of the invention becomes significant.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of operating a semiconductor device, said semiconductor device including:

a substrate composed of silicon semiconductor material and having a surface-adjacent region at a face of said substrate; an insulating layer on said face composed of silicon oxide overlying said surface-adjacent region of the substrate; an electrode on said face overlying said insulating layer above said surface adjacent region, said electrode being composed of polysilicon semiconductor material doped with impurities, wherein said electrode is a gate of a field-effect transistor or plate of a field-effect capacitor; comprising the steps of:

a) applying a first bias voltage to said electrode with respect to said face, said first bias voltage being substantially above a substrate inversion threshold voltage for said semiconductor device but below a selected level, and wherein said selected level is about that of a voltage supply for said semiconductor device, to produce a voltage across said insulating layer of approximately said applied first bias voltage, said first bias voltage being applied after a positive fixed charge is provided at the interface of said insulating layer and said electrode, said positive fixed charge preventing said first bias voltage from causing depletion in said electrode; and b) applying a second bias voltage to said electrode with respect to said face, said second bias voltage being above said selected level, to produce a voltage across said insulating layer of substantially less than said second bias voltage, said polysilicon semiconductor material being doped at a level not more that about $5 \times 10^{18}/cm^3$ so that an inversion layer is created in said surface-adjacent region by said second bias voltage applied to said electrode.

2. A device according to claim 1 wherein the doping level of said electrode is less than about $10^{17}/cm^3$.

3. A method of operating an insulated gate field-effect transistor, said transistor including:

N+source and drain regions formed in a P-type face of a silicon substrate at spaced-apart locations; a silicon oxide gate insulator overlying said face in an area between said source and drain regions; and a gate electrode overlying said gate insulator and composed of polycrystalline silicon doped with N-type impurities at a doping level not exceeding about $5 \times 10^{18}/cm^3$, and wherein an interface region between said gate electrode and said gate insulator contains a positive fixed charge; comprising the steps of:

a) applying a first voltage to said gate electrode with respect to said face, said first voltage being above a substrate inversion threshold voltage for said transistor but below a selected level, to produce a voltage across said insulating layer of approximately said first voltage, said selected level being about a supply voltage level for said transistor, said positive fixed charge preventing said first voltage from causing depletion in said gate electrode;

b) applying a second voltage to said gate electrode with respect to said face, said second voltage being above said selected level, to produce a voltage across said insulating layer of substantially less than said second voltage due to depletion in said gate electrode, said positive fixed charge functioning to reduce degradation of performance of said transistor for voltages on said gate electrode of no more than said selected level.

4. A method according to claim 3 wherein said gate electrode enters a condition of deep depletion when a transient overvoltage is applied to said gate electrode at a level above a bias voltage, to thereby limit the voltage drop across said gate insulator for transient overvoltage but not for said bias voltage.

5. A method of operating a semiconductor device having an electrode of semiconductor material overlying a layer of insulator material above a face of a semiconductor substrate, wherein said electrode is doped with impurity at a level of not greater than about $5 \times 10^{18}/cm^3$, and wherein a positive fixed charge is provided at the interface of said electrode and said layer of insulating material by an implantation of an ionic species in said insulating layer, comprising the steps of:

a) applying a first voltage to said electrode with respect to said face, said first voltage being above a substrate inversion threshold voltage for said semiconductor device but below a selected level, said selected level being about a supply voltage level for said semiconductor device, to produce a voltage across said insulating layer of approximately said applied first voltage;

b) applying a second voltage to said electrode with respect to said face, said second voltage being above said selected level to produce a voltage across said insulating layer of substantially less than said second voltage due to depletion in said electrode, but depletion in said electrode being prevented for voltages not above said first voltage due to said positive fixed charge.

\* \* \* \* \*